United States Patent
Asai et al.

(10) Patent No.: US 6,972,959 B2
(45) Date of Patent: Dec. 6, 2005

(54) HEAT DISSIPATING DEVICE FOR ELECTRONIC COMPONENTS OF ELECTRONIC CONTROL DEVICES

(75) Inventors: Nobuhiro Asai, Aichi-ken (JP); Yoshitami Saito, Aichi-ken (JP)

(73) Assignee: Advics Co., Ltd., Kariya (JP)

( * ) Notice: Subject to any disclaimer, the term of this patent is extended or adjusted under 35 U.S.C. 154(b) by 0 days.

(21) Appl. No.: 10/713,152

(22) Filed: Nov. 17, 2003

(65) Prior Publication Data

US 2004/0142180 A1    Jul. 22, 2004

(30) Foreign Application Priority Data

Nov. 18, 2002 (JP) .............................. 2002-333981

(51) Int. Cl.[7] .............................................. H05K 7/20
(52) U.S. Cl. ...................... 361/719; 361/704; 361/717; 361/718; 361/720; 174/252; 165/80.2; 165/185
(58) Field of Search ........................ 361/704, 707–709, 361/712–714, 719, 720; 174/16.1, 16.3, 252; 165/80.3, 185

(56) References Cited

U.S. PATENT DOCUMENTS

| | | | |
|---|---|---|---|
| 5,276,584 A | * | 1/1994 | Collins et al. .............. 361/718 |
| 5,467,251 A | * | 11/1995 | Katchmar .................. 361/719 |
| 5,590,026 A | * | 12/1996 | Warren et al. .............. 361/704 |
| 5,708,566 A | * | 1/1998 | Hunninghaus et al. ...... 361/704 |
| 6,044,899 A | * | 4/2000 | Langley et al. ........ 165/104.33 |
| 6,058,013 A | * | 5/2000 | Christopher et al. ........ 361/704 |
| 6,377,462 B1 | * | 4/2002 | Hajicek et al. ............. 361/719 |
| 6,600,653 B2 | * | 7/2003 | Koike et al. ................ 361/704 |
| 6,816,377 B2 | * | 11/2004 | Itabashi et al. ............. 361/704 |

FOREIGN PATENT DOCUMENTS

JP        10-150283        6/1998

* cited by examiner

Primary Examiner—Boris Chervinsky
(74) Attorney, Agent, or Firm—Buchanan Ingersoll PC

(57) ABSTRACT

A heat dissipation device is disclosed for dissipating the heat produced by electronic components (16) of an electronic control device. The electronic control device includes a circuit board (14), a resin protective case (10), and a metal actuator block (20). The electronic components are mounted on the circuit board. The protective case confines the circuit board within a thermally restrictive environment. The actuator block is mounted to the outside of the protective case. The heat dissipation device includes a heat conduction path (24, 30) that serves to thermally conduct the heat produced by the electronic components from the interior of the protective case to the actuator block.

19 Claims, 3 Drawing Sheets

HEAT DISSIPATING DEVICE FOR ELECTRONIC COMPONENTS OF ELECTRONIC CONTROL DEVICES

This application claims priority to Japanese patent application serial number 2002-333981, the contents of which are incorporated herein by reference.

BACKGROUND OF THE INVENTION

1. Field of the Invention

The present invention relates to heat dissipating devices for electronic components of electronic control devices, and in particular to electronic control devices, in which a circuit board having electronic components mounted thereon is confined within a protective case that is made of synthetic resin. For example, such electronic control devices may include a brake control device that has an actuator integrated with an electronic control unit for controlling a hydraulic pressure. The present invention also relates to electronic control devices having the heat dissipating devices.

2. Description of the Related Art

Electronic control devices having integral actuators are known. FIG. 4 shows a brake control device as an example of such known electronic control devices. As is apparent from FIG. 4, an ECU (electronic control unit) includes a printed circuit board 14 and is disposed within a protective case 10 made of synthetic resin. The circuit board 14 is made of electrical insulation material, such as bakelite and epoxy resin. A patterned copper film (not shown) is formed on one or either side of the circuit board 14 and various kind of electronic components 16 (only one electronic part is shown in FIG. 4) are secured to the circuit board 14 by soldering. In addition, the circuit board 14 has a plurality of through-holes 14a formed in the circuit board 14 to extend throughout the thickness thereof. By utilizing the through-holes 14a, the patterned copper films on either side of the circuit board 14 can be electrically connected or the patterned copper film on one side of the circuit board 14 can be electrically connected to a ground pattern (not shown) that is embedded within the circuit board 14. An actuator block 20 made of aluminum alloy is secured to the outer side (lower side as viewed in FIG. 4) of the protective case 10 by means of bolts 24. The actuator block 20 has a plurality of solenoids 22.

During the operation of the brake control computer, heat may be produced by the electronic components 16 and such heat may be transferred from the side of an upper surface 14b to the side of a lower surface 14c of the circuit board 14 via through-holes 14a, so that the heat may be dissipated from the rear side of the circuit board 14. However, the circuit board 14 is confined within the resin protective case 10. In particular, in the situation where the brake control computer is adapted to be disposed within an engine bay of a vehicle, the circuit board 14 is confined within a sealed protective case 10 in order to provide a degree of waterproof protection for the electronic components. Therefore, in such a sealed situation, the heat generated from the circuit board 14 is inhibited from being transferred to the environment outside of the protective case 10. As a result, the ambient temperature level within the protective case 10 may rise. One method of lowering the rate of temperature increase within the protective case 10 is by increasing the heat sinking capacity of the circuit board 14. However, for long-term operation of the electronic components 16, it is not possible to lower the saturation temperature within the protective case 10 by using the heat sinking capacity of the circuit board 14.

In order to improve the efficiency of dissipation of heat from within a protective case, Japanese Laid-Open Patent Publication No. 10-150283 proposes a heat dissipation structure in which a heat dissipation plate is disposed in contact with an inner wall of the protective case and a heat dissipation layer is formed on a circuit board within the protective case. The heat dissipation plate is connected to the heat dissipation layer via a thermally conductive element, e.g., a metal leaf spring and a metal screw that have good thermal heat conductivity. With this heat dissipation structure, the heat produced by electronic components, mounted on the circuit board, is conducted from the heat dissipation layer to the heat dissipation plate via the thermally conductive elements. The heat may then be dissipated to the environment outside of the protective case.

The technique proposed by the above publication may improve the heat dissipation efficiency to some extent in comparison with the known structure shown in FIG. 4. However, in the situation that the electronic control device has a protective case that is made of a resin material, as in a brake control computer, the protective case may have very low capacity for thermal conductivity. Therefore, the overall efficiency of heat dissipation to the outside of the protective case remains low even with the incorporation of the teachings of the above publication. Although the actuator block 20, mounted to the outside of the protective case 10, may be made of an aluminum alloy with a relatively high degree of thermal conductivity, in the case shown in FIG. 4 of the known electronic control device, the heat dissipation property of the actuator block 20 may go unrealized in the effort to improve the heat dissipation efficiency of the heat generated within the protective case 10 because the actuator block 20 is thermally separated from the circuit board 14 by the protective case 10.

SUMMARY OF THE INVENTION

It is accordingly an object of the present invention to teach improved techniques for effectively dissipating heat produced by an electronic component(s) that is(are) confined within a resin protective case.

According to one aspect of the present teachings, heat dissipation devices are taught for dissipating the heat produced by at least one heat generating electronic component of an electronic control device. The electronic control device includes a circuit board, a resin protective case and a metal actuator block. The electronic component is mounted on the circuit board. For example, the electronic component may be an integrated circuit (IC), a transistor, a capacitor, a resistor, or any other component that generates heat during operation. The protective case defines an interior environment. The circuit board is substantially confined within the interior environment formed by the protective case. The actuator block is mounted outside of the protective case. The actuator block may include actuators. In the case that the electronic control device is configured as a brake control device, the actuators may be solenoids that serve to operate valves for controlling the flow of a hydraulic fluid supplied to various brake devices. The heat dissipation device includes a heat conduction path(s) that serves to conduct the heat produced by the electronic component(s) from the inside of the protective case to the actuator block.

Therefore, although the circuit board with at least one heat generating electronic component is confined within the protective resin case, the heat produced by the electronic component may be conducted to the external actuator block via the heat conductive path(s). The heat may then be effectively dissipated into the outside environment from the actuator block. As a result, increases in the ambient interior temperature of the protective case as well as increases in temperature of the electronic components may be minimized.

Preferably, a separate member or members forms the heat conduction path. By using a separate member to form the heat conduction path, the material selection of the member is not limited to the resin used in the protective case. Therefore, the heat conductivity of the heat conduction path may be improved by selecting a thermally conductive material to form the separate member or members.

In another aspect of the present teachings, the heat conduction path includes a first heat conductive member and a second heat conductive member. The first heat conductive member is disposed within the protective case and arranged and constructed so that the heat generated by the electronic component(s) is(are) conducted to the first heat conductive member. The second heat conductive member communicates with the environment outside of the protective case. The second member may extend from the inside to the outside of the protective case and has a first end contacting the first heat conductive member and a second end contacting the actuator block. Therefore, a heat conduction path leading to the external environment can be readily formed within the protective case.

In an additional aspect of the present teachings, the second heat conductive member comprises at least one bolt that is adapted to fix the actuator block in a position relative to the protective case. Because the bolt for fixing the actuator block to the protective case can be used as the second heat conductive member, the heat-dissipating device may have a relatively simple structure. In addition, use of the bolt as the second member removes the necessity of creating additional space on the side of the actuator block for contacting portions of the second heat conductive member. Thereby attaining additional freedom of actuator block design.

In further aspect of the present teachings, the first heat conductive member includes a sleeve arranged and constructed to receive the bolt and extending from an interior surface of the protective case toward the actuator block (see FIG. 2 for an example). A large interface area can be established between the first and second conductive members via the overlap between the bolt and the inner surface of the sleeve. As a result of the large interface area, the efficiency of conduction of heat from the first heat conductive member to the second heat conductive member can be improved to further permit heat transfer to the actuator block.

Preferably, the sleeve is extended to result in one end contacting the actuator block. This allows the heat to be conducted to the actuator block directly from the first heat conductive member. As a result, the thermal conductivity of the heat conductive path may be further improved by providing a direct path from the heat generating electronic components via the first heat conductive member to the actuator block. Alone or in combination with another aspect of the invention, at least one thermally conductive bolt used as a fixing device to attach the actuator block to the protective case can provide an additional pathway for the conduction of heat from the interior of the protective case to the actuator block.

In a further aspect of the present teachings, the first and second heat conductive members are made of metal having a high rate of thermal conductivity. Preferably, aluminum alloy may be advantageously used as a material of the first and second heat conductive members. Using a material with a high rate of thermal conductivity allows the overall heat conductivity of the heat conductive path to be improved.

In yet a further aspect of the present teachings, the protective case includes a tubular extension that extends from the protective case toward the actuator block. The tubular extension serves to receive the bolt. Therefore, the tubular extension may provide a guide for assembling the bolt between the protective case and the actuator block. Preferably, the tubular extension receives the bolt as well as the sleeve of the first heat conductive member.

In a further aspect of the present teachings, an electrical insulation member is disposed between the electronic component and the metal first heat conductive member. The electrical insulation member helps to prevent an electrical connection between the electronic component and the heat conduction path.

In a further aspect of the present teachings, the first conductive member is joined to the protective case by an insert molding process. For example, the metal first conductive member may be pre-assembled into a mold for molding the resin protective case. Then a molding process, e.g. an injection molding process, of the protective case is performed. As a result, the first conductive member may be joined to the protective case at the same time that the protective case is molded. A relatively simple process can therefore manufacture the protective case containing the first conductive member.

In another further aspect of the present teachings, electronic control devices are taught that include the above various aspects of the heat dissipating devices individually or in combination with one another.

BRIEF DESCRIPTION OF THE DRAWINGS

Additional objects, features, and advantages, of the present invention will be readily understood after reading the following detailed description together with the claims and the accompanying drawings, in which:

DETAILED DESCRIPTION OF THE INVENTION

Each of the additional features and teachings disclosed above and below may be utilized separately or in conjunction with other features and teachings to provide improved heat dissipating devices and methods of manufacturing and using such heat dissipating devices. Representative examples of the present invention, which examples utilize many of these additional features and teachings both separately and in conjunction with one another, will now be described in detail with reference to the attached drawings. This detailed description is merely intended to teach a person of skill in the art further details for practicing preferred aspects of the present teachings and is not intended to limit the scope of the invention. Only the claims define the scope of the present invention. Therefore, combinations of features and steps disclosed in the following detailed description may not be necessary to practice the invention in the broadest sense, and are instead taught merely to particularly describe representative examples of the invention. Moreover, various features of the representative examples and the dependent claims may be combined in ways that are not specifically enumerated in order to provide additional useful embodiments of the present teachings.

Figure 4:
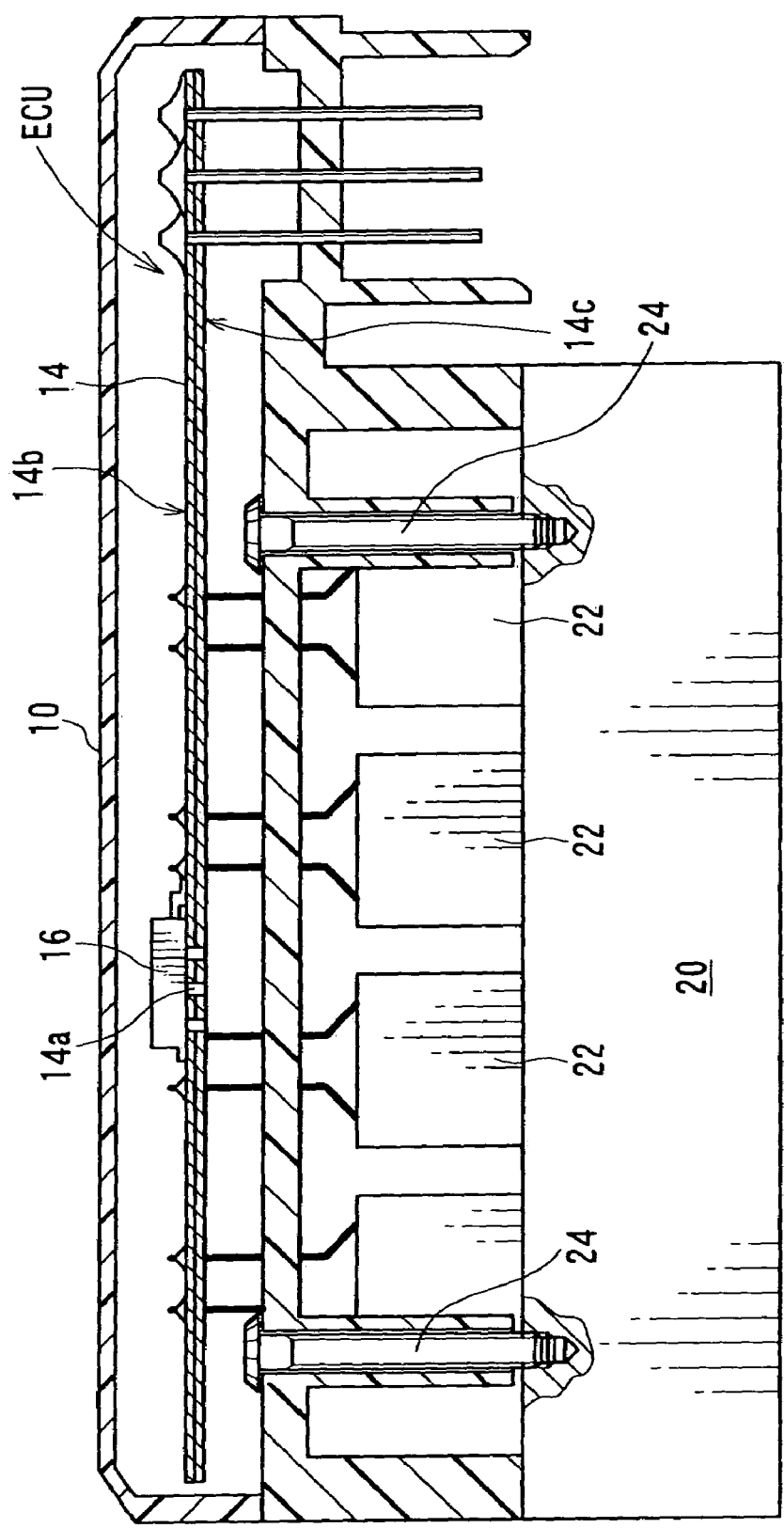
FIG. 4 is a cross sectional view of a known electronic control device for controlling the flow of a hydraulic fluid supplied to various brake devices.

A representative embodiment will now be described with reference to FIG. 1, which shows a representative electronic control device that is configured as a brake control device for controlling a hydraulic pressure that is supplied to various brake devices of an automobile (not shown). The construction of the representative electronic control device is largely the same as the known electronic control device shown in FIG. 4. Therefore, the elements similar to the parts of the known electronic control device shown in FIG. 4 are labeled with the identical reference numerals as in FIG. 4 and an explanation of these elements will not be repeated.

Figure 1:
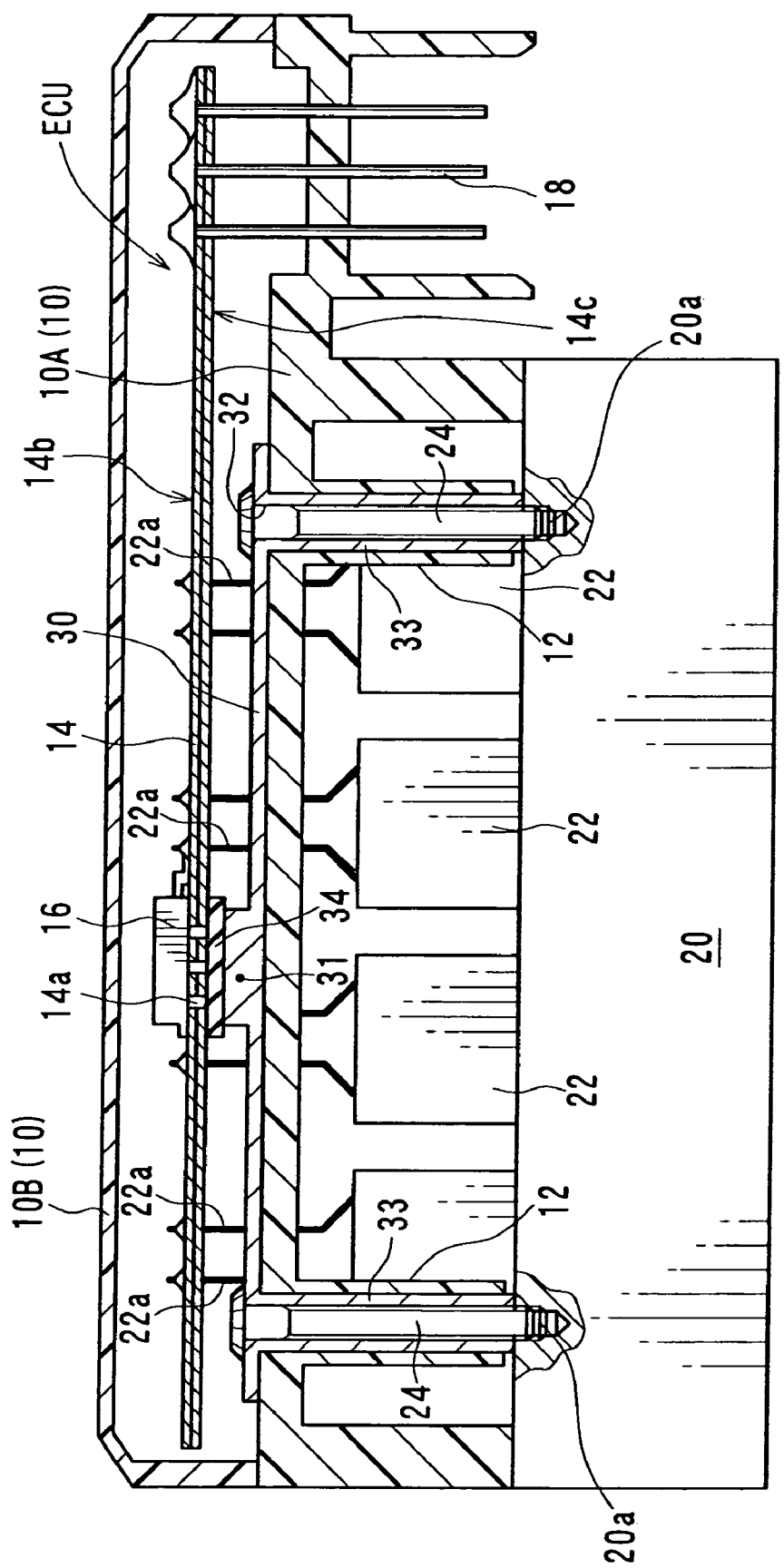
FIG. 1 is a cross sectional view of a representative electronic control device for controlling the flow of a hydraulic fluid supplied to various brake devices.

Referring to FIG. 1, the representative electronic control device includes an ECU (electronic control unit) that is sealingly confined within the interior environment of a protective case 10 that is made of synthetic resin. A printed circuit board 14 has a multi-layered configuration and has patterned copper films (not shown) disposed on the upper surface 14b and the lower surface 14c of the circuit board 14. Various electronic components 16 (only one electronic component 15 is shown in FIG. 1), such as ICs, transistors, resisters, capacitors, and other heat generating components, are secured by soldering to the copper film disposed on one side of the printed circuit board (the upper side as viewed in FIG. 1). Through-holes 14a are formed in the circuit board 14 in positions opposing each of the electronic components 16 and extend throughout the thickness of the circuit board 14. The inner surface of each through-hole 14a is plated with copper arranged and constructed so that the copper films disposed on the upper surface 14b and the lower surface 14c are electrically connected to each other or to a ground pattern (not shown) that is disposed as an intermediate layer within the circuit board 14. The circuit board 14 has terminals 18 for connection with an external device. The terminals 18 extend to the outside environment through the protective case 10.

The protective case 10 includes a case body 10A and a case cover 10B. An actuator block 20 includes a plurality of solenoids 22 that are mounted to an outer side (the lower side as viewed in FIG. 1) of the case body 10A. Each of the solenoids 22 is electrically connected to the patterned copper film on the upper surface 14b of the circuit board 14 via lead lines 22a. Each solenoid 22 is controlled to turn on and off according to electrical signals from the ECU. The actuator block 20 is made of aluminum alloy and has hydraulic channels (not shown) formed therein. The hydraulic channels have valves that are opened and closed by the operation of the respective solenoids 22. The valves control the supply of a hydraulic fluid to various brake devices (not shown).

A heat conductive member 30 is mounted to an interior surface of the case body 10A. The heat conductive member 30 is made of metal, e.g. preferably aluminum alloy, that has a high capability for thermal heat conductivity. The heat conductive member 30 has a plate-like configuration as a whole but can contain various projections 31 (only one projection 31 is shown in FIG. 1). The projections 31 are positioned to correspond to the locations of heat sources on the printed circuit board 14, typically heat generating electronic components 16 mounted to the upper surface 14b. The projections 31 extend vertically toward the lower surface 14c of the circuit board 14. A thermally conductive, electric insulating device 34 is interposed between each projection 31 and the lower surface 14c of the circuit board 14 in order to prevent the conduction of electricity between the projection 31 and the printed circuit board 14.

A plurality of bolt receiving portions 12 are formed on the lower exterior surface of the case body 10A and extend downward (as viewed in FIG. 1) toward the actuator block 20. Each of the bolt receiving portions 12 has a substantially tubular configuration to define an inside space that communicates between interior and exterior of the cavity formed by protective case 10. The heat conductive member 30 has a plurality of tubular extensions 33 disposed at positions corresponding to the bolt receiving portions 12. Each of the tubular extensions 33 defines a bolt insertion hole 32 and is inserted into the corresponding bolt receiving portion 12 of the case body 10A. Preferably, the bolt receiving portions 12 and the tubular extensions 33 are integrated together by an insert molding process with the heat conductive member 30 inserted into a mold prior to forming the case body 10A.

A bolt 24 is inserted into the bolt insertion hole 32 of each tubular extension 33 from the side of the interior space (upper side as viewed in FIG. 1) of the protective case 10. Threaded holes 20a are formed in the upper surface of the actuator block 20, so that the bolt 24 engages the corresponding threaded hole 20a. The bolt 24 is then tightened in order to fix the case body 10A and the actuator block 20 in position relative to each other. As shown in FIG. 1, when all the bolts 24 have been completely tightened, the lower end of each of the tubular extensions 33 contacts the upper surface of the actuator block 20.

The operation for tightening the bolts 24 may be performed before the circuit board 14 is mounted within the case body 10A and naturally before the case cover 10B is mounted to the case body 10A. The bolts 24 may be made of material with a high thermal conductivity, e.g., preferably aluminum alloy.

According to the representative electronic control device as described above, the heat produced by the electronic components 16 mounted to the upper surface 14b of the circuit board 14 may be conducted to the patterned copper film disposed on the lower surface 14c of the circuit board 14 via the copper-plated inner surfaces of the through-holes 14a. The heat may then be conducted to the metal heat conductive members 30 via the insulating device 34 and additionally conducted to the actuator block 20 via the bolts 24 and the tubular extensions 33.

Therefore, a heat conduction path is provided between the circuit board 14 and the actuator block 20 by the heat conductive member 30, its tubular extensions 33 and bolts 24 in order to conduct heat produced by the electronic components 16 to the actuator block 20 that is disposed outside of the protective case 10. Because the actuator block 20 is made of an aluminum alloy, the actuator block 20 has a high capability for thermal conductivity and a large heat sinking capacity. The heat transmitted to the actuator block 20 can therefore be effectively dissipated to the outside environment. As a result, substantial, undesired increases in the ambient temperature within the closed protective case 10 as well as the operating temperature of the individual electronic components 16 can be effectively reduced or minimized.

In addition, because the bolts 24 and the tubular extensions 33 are utilized as portions of the heat conduction path between the heat conduction member 30 and the actuator block 20, no substantial amount of additional space is required for actuator block 20 contact portions in order to effectively conduct the heat. Therefore, the actuator block 20 has more overall freedom of design in configuring a plurality of solenoids 22 and attachments to the ECU. Further, when the bolts 24 are made of an aluminum alloy, the thermal efficiency can be further improved in regards to the conduction of heat from the heat conduction member 30 to the actuator block 20. Improvements in the overall efficiency of the conduction of heat are additionally achieved by choosing a material for the insulation sheet 34 with as high of a coefficient of thermal conductivity as possible while still maintaining the ability to electrically insulate between the copper film on the lower surface 14c of the circuit board 14 and the heat conductive member 30.

Figure 2:
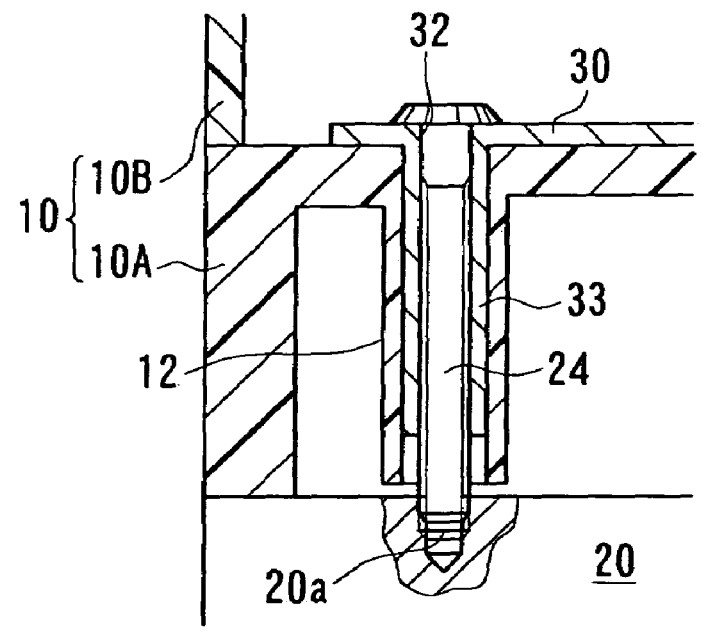
FIG. 2 is a view showing a specific modification of a heat conductive path of FIG. 1.
Figure 3:
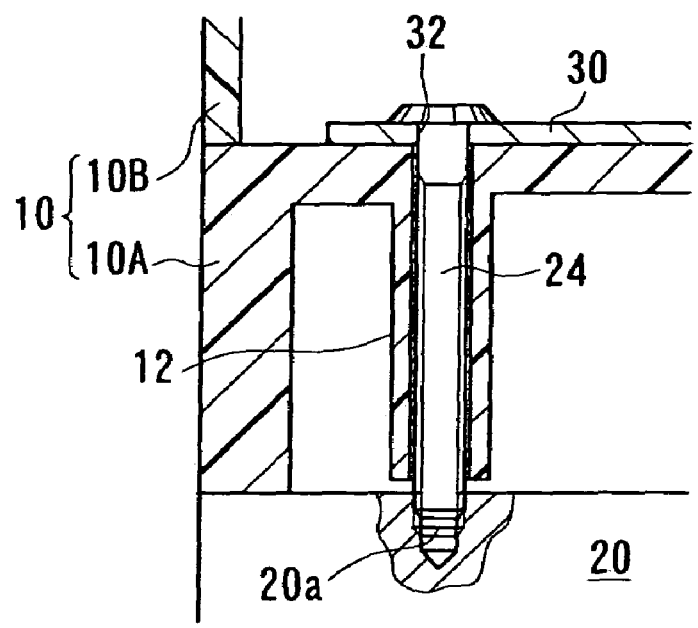
FIG. 3 is a view showing another specific modification of a heat conductive path of FIG. 1.

The above representative embodiment may be modified in various ways. FIGS. 2 and 3 correspond to a section of FIG. 1 but show modifications of portions of the heat transmission path formed by the bolts 24 and the tubular extensions 33 of FIG. 1.

In the first modification shown in FIG. 2, the lengths of the tubular extensions 33 (only one tubular extension 33 is shown in FIG. 2) are determined such that the lower end of each tubular extension 33 does not contact the upper surface of the actuator block 20 when the bolts 24 (only one bolt 24 is shown in FIG. 2) have been completely tightened. In this modification, essentially only the bolts 24 perform the direct conduction of heat from the heat conductive member 30 to the actuator block 20. However, the tubular extensions 33 still serve to provide a large interface area between the bolts 24 and the heat conductive member 30 in order to assist in the conduction of heat from the heat conductive member 30 and the actuator block 20.

In the modification shown in FIG. 3, the tubular extensions 33 are eliminated from the heat conductive member 30, resulting in only the bolts 24 (only one bolt 24 is shown in FIG. 3) being directly inserted into the corresponding bolt insertion portions 12 of the case body 10A. In this modification, essentially only the bolts 24 perform the primary conduction of heat from the heat conductive member 30 to the actuator block 20. This embodiment may still effectively dissipate the heat if the heat-generating periods of the electronic components 16 are relatively limited or spaced apart in time, or if the bolts 24 are made of material having a high capacity for thermal heat conductivity, e.g. an aluminum alloy.

Although the present invention has been described in connection with an electronic control device that is used for controlling the hydraulic fluid supplied to automobile brake devices, the present invention also may be applied to any other electronic control devices that have a thermally restrictive protective case confining a circuit board with heat generating electronic components mounted thereon, and a metal actuator block that is mounted to the outside of the protective case.

What is claimed is:

1. A heat dissipation device for dissipating heat produced by:
   at least one electronic component of an electronic control device, which electronic control device comprises;
      a circuit board having the at least one electronic component mounted thereon; and
      a protective case made of resin and defining an interior environment; and
      an actuator block made of metal and mounted outside of the protective case; and
   wherein the protective case substantially confines the circuit board within the interior environment; and
   wherein a heat conduction path is arranged and constructed to conduct the heat generated by the electronic component from the interior environment formed by the protective case to the actuator block,
   wherein the heat conduction path includes a first heat conductive member and a plurality of second heat conductive members,
   wherein the first heat conductive member is disposed within the interior environment of the protective case, so that the heat of the electronic component is conducted to the first heat conductive member,
   wherein the second heat conductive members extend from the interior environment to communicate with the environment outside of the protective case, and
   wherein each of the second heat conductive members has a first end contacting the first heat conductive member and a second end contacting the actuator block, so that the conduction of heat between the first heat conductive member and the actuator block is made at plural positions.

2. A heat dissipating device as in claim 1, wherein at least one of the first and second heat conductive members are made of metal having good thermal heat conductivity properties.

3. A heat dissipating device as in claim 2, wherein at least one of the first and second heat conductive members are made of aluminum alloy.

4. A heat dissipating device as in claim 2, further including an electrical insulation member disposed between the electronic component and the first heat conductive member.

5. A heat dissipating device as in claim 2, wherein the first heat conductive member is joined to the protective case by an insert molding process.

6. A heat dissipation device for dissipating heat produced by:
   at least one electronic component of an electronic control device, which electronic control device comprises;
      a circuit board having the at least one electronic component mounted thereon; and
      a protective case made of resin and defining an interior environment; and
      an actuator block made of metal and mounted outside of the protective case; and
   wherein the protective case substantially confines the circuit board within the interior environment;
   wherein a heat conduction path is arranged and constructed to conduct the heat generated by the electronic component from the interior environment formed by the protective case to the actuator block;
   wherein the heat conduction path includes a first heat conductive member and a second heat conductive member,
   wherein the first heat conductive member is disposed within the interior environment of the protective case, so that the heat of the electronic component is conducted to the first heat conductive member,
   wherein the second heat conductive member extends from the interior environment to communicate with the environment outside of the protective case and has a first end contacting the first heat conductive member and a second end contacting the actuator block;
   wherein at least one of the first and second heat conductive members are made of metal having aood thermal heat conductivity properties;
   wherein the second heat conductive member comprises at least one bolt that is adapted to fix the actuator block in position relative to the protective case; and wherein the first heat conductive member includes a sleeve arranged and constructed to receive the bolt and extending from the interior of the protective case toward the actuator block.

7. A heat dissipation device as in claim 6, wherein the sleeve of the first heat conductive member has one end contacting the actuator block.

8. A heat dissipating device as in claim 7, wherein at least one of the first and second heat conductive members are made of aluminum alloy.

9. A heat dissipation device for dissipating heat produced by:
at least one electronic component of an electronic control device, which electronic control device comprises;
a circuit board having the at least one electronic component mounted thereon; and
a protective case made of resin and defining an interior environment; and
an actuator block made of metal and mounted outside of the protective case; and
wherein the protective case substantially confines the circuit board within the interior environment; and
wherein a heat conduction path is arranged and constructed to conduct the heat generated by the electronic component from the interior environment formed by the protective case to the actuator block,
wherein the heat conduction path includes a first heat conductive member and a second heat conductive member,
wherein the first heat conductive member is disposed within the interior environment of the protective case, so that the heat of the electronic component is conducted to the first heat conductive member,
wherein the second heat conductive member extends from the interior environment to communicate with the environment outside of the protective case and has a first end contacting the first heat conductive member and a second end contacting the actuator block,
wherein the second heat conductive member comprises at least one bolt that is made of metal having good thermal heat conductivity and is adapted to fix the actuator block in position relative to the protective case, and
wherein the bolt has a head engaging with a part of the first heat conductive member and a shank threadably engaging with the actuator block.

10. A heat dissipation device for dissipating heat produced by:
at least one electronic component of an electronic control device, which electronic control device comprises;
a circuit board having the at least one electronic component mounted thereon; and
a protective case made of resin and defining an interior environment; and
an actuator block made of metal and mounted outside of the protective case; and
wherein the protective case substantially confines the circuit board within the interior environment; and
wherein a heat conduction path is arranged and constructed to conduct the heat generated by the electronic component from the interior environment formed by the protective case to the actuator block,
wherein the heat conduction path includes a first heat conductive member and a second heat conductive member,
wherein the first heat conductive member is disposed within the interior environment of the protective case, so that the heat of the electronic component is conducted to the first heat conductive member,
wherein the second heat conductive member extends from the interior environment to communicate with the environment outside of the protective case and has a first end contacting the first heat conductive member and a second end contacting the actuator block,
wherein at least one of the first and second heat conductive members are made of metal having good thermal heat conductivity properties, and
wherein the protective case includes a tubular extension that extends from the protective case toward the actuator block, and the tubular extension is arranged and constructed to receive a bolt.

11. A heat dissipating device as in claim 10, wherein the tubular extension is arranged and constructed to receive the bolt together with the sleeve of the first heat conductive member.

12. A heat dissipation device for dissipating heat produced by:
at least one electronic component of an electronic control device, which electronic control device comprises;
a circuit board having the at least one electronic component mounted thereon; and
a protective case made of resin and defining an interior environment; and
an actuator block made of metal and mounted outside of the protective case; and
wherein the protective case substantially confines the circuit board within the interior environment; and
a heat conduction path includes a first heat conductive member and a plurality of second heat conductive members; and
wherein the first heat conductive member is disposed within the interior environment of the protective case, so that the heat of the electronic component is conducted to the first heat conductive member; and
wherein the second heat conductive members extend from the interior environment to communicate with the environment outside of the protective case, and
wherein each of the second heat conductive members has a first end contacting the first heat conductive member and a second end contacting the actuator block, so that the conduction of heat between the first heat conductive member and the actuator block is made at plural positions, and
wherein the first and second heat conductive members are made of metal having good thermal heat conductivity properties; and
wherein an electrical insulation member is disposed between the electronic component and the first heat conductive member.

13. A heat dissipation device as in claim 12, wherein the second heat conductive members comprise bolts that are adapted to fix the actuator block in position relative to the protective case.

14. A heat dissipation device for dissipating heat produced by:
at least one electronic component of an electronic control device, which electronic control device comprises;
a circuit board having the at least one electronic component mounted thereon; and
a protective case made of resin and defining an interior environment; and
an actuator block made of metal and mounted outside of the protective case; and wherein the protective case substantially confines the circuit board within the interior environment; and a heat conduction path includes a first heat conductive member and a second heat conductive member; and wherein the first heat conductive member is disposed within the interior environment of the protective case, so that the heat of the electronic component is conducted to the first heat conductive member; and wherein the second heat conductive member extends from the interior environment to communicate with the environment outside of the protective case and has a first end contacting the first heat conductive member and a second end contacting the actuator block; and wherein both of the first and second heat conductive members are made of metal having good thermal heat conductivity properties;

wherein an electrical insulation member is disposed between the electronic component and the first heat conductive member;

wherein the second heat conductive member comprises at least one bolt that is adapted to fix the actuator block in position relative to the protective case; and wherein the first heat conductive member includes a sleeve arranged and constructed to receive the bolt and extending from the interior of the protective case toward the actuator block.

15. A heat dissipation device as in claim 14, wherein the sleeve of the first heat conductive member has one end contacting the actuator block.

16. An electronic control device comprising:

at least one heat generating electronic component; and a circuit board having at least one electronic component mounted thereon; and a protective case made of resin and defining an interior environment; and an actuator block made of metal and mounted outside of the protective case; wherein the protective case substantially confines the circuit board within the interior environment; and a heat dissipating device comprising a heat conduction path, wherein the heat conduction path includes a first heat conductive member and a plurality of second heat conductive members; and wherein the first heat conductive member is disposed within the interior environment of the protective case, so that the heat of the electronic component is conducted to the first heat conductive member; and wherein the second heat conductive members extend from the interior environment to communicate with the environment outside of the protective case, wherein each of the second conductive members has a first end contacting the first heat conductive member and a second end contacting the actuator block so that the conduction of heat between the first heat conductive member and the actuator block is made at plural positions; and wherein at least one of the first and second heat conductive members are made of metal having good thermal heat conductivity properties.

17. An electronic control device as in claim 16, wherein the second heat conductive members comprise bolts that are adapted to fix the actuator block in position relative to the protective case.

18. An electronic control device comprising;

at least one heat generating electronic component; and a circuit board having at least one electronic component mounted thereon; and a protective case made of resin and defining an interior environment; and an actuator block made of metal and mounted outside of the protective case; wherein the protective case substantially confines the circuit board within the interior environment; and a heat dissipating device comprising a heat conduction path, wherein the heat conduction path includes a first heat conductive member and a second heat conductive member; and wherein the first heat conductive member is disposed within the interior environment of the protective case, so that the heat of the electronic component is conducted to the first heat conductive member; and wherein the second heat conductive member extends from the interior environment to communicate with the environment outside of the protective case and has a first end contacting the first heat conductive member and a second end contacting the actuator block; and wherein at least one of the first and second heat conductive members are made of metal having good thermal heat conductivity properties; and wherein the second heat conductive member comprises at least one bolt that is adapted to fix the actuator block in position relative to the protective case; and wherein the first heat conductive member includes a sleeve arranged and constructed to receive the bolt and extending from the interior of the protective case toward the actuator block.

19. An electronic control device as in claim 18, wherein the sleeve of the first heat conductive member has one end contacting the actuator block.

* * * * *